United States Patent
Cook et al.

(10) Patent No.: US 6,235,652 B1
(45) Date of Patent: May 22, 2001

(54) HIGH RATE SILICON DIOXIDE DEPOSITION AT LOW PRESSURES

(75) Inventors: Robert C. Cook; Daniel L. Brors, both of Livermore, CA (US)

(73) Assignee: Torrex Equipment Corporation, Livermore, CA (US)

( * ) Notice: Subject to any disclaimer, the term of this patent is extended or adjusted under 35 U.S.C. 154(b) by 0 days.

(21) Appl. No.: 09/396,586

(22) Filed: Sep. 15, 1999

Related U.S. Application Data

(63) Continuation-in-part of application No. 09/228,835, filed on Jan. 12, 1999, now Pat. No. 6,167,837, and a continuation-in-part of application No. 08/909,461, filed on Aug. 11, 1997.
(60) Provisional application No. 60/071,572, filed on Jan. 15, 1998.

(51) Int. Cl.$^7$ .................................................. H01L 21/469
(52) U.S. Cl. ..................... 438/787; 438/680; 438/784; 257/632; 257/636
(58) Field of Search .................................... 257/632, 636; 438/787, 784, 800, 680

(56) References Cited

U.S. PATENT DOCUMENTS 5,551,985 * 9/1996 Brors et al. .......................... 118/725

OTHER PUBLICATIONS

Wolf et al., Silicon Processing for the VLSI Era: vol. 1–Process Technology, 1986, pp. 169–170.*

* cited by examiner

Primary Examiner—Chandra Chaudhari
Assistant Examiner—Lisa Kilday
(74) Attorney, Agent, or Firm—David H. Jaffer; Pillsbury Winthrop LLP

(57) ABSTRACT

High rate silicon dioxide deposition at low pressures, including a method of depositing silicon dioxide providing a high rate of deposition at a low process chamber pressure, yielding a film with excellent uniformity and with an absence of moisture inclusion and gas phase nucleation. According to the method, a wafer is placed in a reaction chamber wherein a reactant gas flow of silane and oxygen is directed in parallel with the wafer via a plurality of temperature-controlled gas injectors, and confined to a narrow region above the wafer. The gas is injected at a high velocity resulting in the deposition rate being limited only by the rate of delivery of unreacted gas to the wafer surface and the rate of removal of by-products. The high velocity gas stream passing across the wafer has the effect of thinning the layer adjacent the wafer surface containing reaction by-products, known as the "boundary layer," which results in faster delivery of the desired reactant gas to the wafer surface. The high velocity gas flow causes a very low gas residence time in the area of interest (i.e. above the substrate surface). The gas flow sweeps out unwanted reaction by-products resulting in a further increase in the relative concentration of the desired reactant species and reduced incorporation of unwanted reaction by-products in the deposited film.

15 Claims, 3 Drawing Sheets

PROCESS SPECIFICATIONS

OXYGEN FLOW: 300 - 600 SCCM

SILANE FLOW: 100 - 300 SCCM

VOLUME RATIO: 1.5:1 TO 2.5:1
(OXYGEN-TO-SILANE)

CHAMBER PRESSURE: < 1 TORR

GAS VELOCITY: > 100 CM/SEC
(ADJUST FOR GAS RESIDENCY < 200 MSEC)

WAFER TEMPERATURE: 300°C - 700°C

WAFER ROTATION: 5 RPM (APPROXIMATE)

FIG. 3

HIGH RATE SILICON DIOXIDE DEPOSITION AT LOW PRESSURES

This application is a continuation-in-part of application Ser. No. 09/228,835 filed Jan. 12, 1999 now U.S. Pat. No. 6,167,837, which is a Provisional Application No. 60/171,572 filed Jan. 15, 1998 and a continuation-in-part of Ser. No. 08/909,461 filed on Aug. 11, 1997.

BACKGROUND OF THE INVENTION

1. Field of Invention

The present invention relates generally to methods for chemical vapor deposition (CVD) of silicon dioxide, and more particularly to a method for CVD of silicon dioxide at a high deposition rate and low reaction chamber pressure using a reactant gas including silane and oxygen.

2. Description of the Prior Art

Silicon dioxide is one of the most commonly used materials in the manufacturing of semiconductor devices, and can be "grown" or "deposited" onto silicon substrates. Silicon dioxide is grown by subjecting the silicon substrate to oxygen or water vapor at high temperature, i.e. >900° C. (as documented in S. Wolf and R. N. Tauber, *Silicon Processing for the VLSI Era*, Volume 1 *Process Technology*, Lattice Press (1986), pages 198, 210). Deposited silicon dioxide is typically done by Chemical Vapor Deposition (CVD) at lower temperatures, i.e. °600° C. (See A. Sherman, *Chemical Vapor Deposition for Microelectronics*, Noyes Publications, Park Ridge, N.J. (1987), pages 66–77.)

Deposited oxides, because of the low temperature process, are used extensively as the insulating layer between multilayer metallization of today's integrated circuits. Silicon dioxide has been deposited by PVD (as disclosed in U.S. Pat. No. 4,624,859) and various CVD processes, both at atmospheric pressure (see U.S. Pat. No. 5,360,646) and at low pressures (see Sherman, pages 66–77). Low-pressure depositions have superior film qualities over depositions at atmospheric pressure and are therefore usually the process of choice (see Sherman, pages 66–77). Low pressure depositions are accomplished by placing a substrate in a vacuum chamber, heating the substrate and introducing silane (as disclosed in U.S. Pat. No. 4,900,591), or any similar silicon precursor such as dichlorosilane, silicon tetrachloride, TEOS (see U.S. Pat. No. 3,934,060) and the like, with oxygen or any similar oxygen precursor, e.g. nitrous oxide, ozone (see U.S. Pat. No. 5,000,113), etc. Deposition rates of approximately 20 to 30 angstroms per minute are typical for low pressure processes (<1 Torr) (see Sherman, page 70), and 50 to 140 angstroms per minute are typical for high pressure processes (>1 Torr) (see U.S. Pat. No. 4,900,591). Higher deposition rates of 2,000 angstroms per minute have been reported for plasma enhanced depositions (see U.S. Pat. No. 5,000,113). Although all of these CVD processes have been used in manufacturing of microelectronics, they all have disadvantages. For example, the process may have a very low rate of deposition, or poor uniformity across the silicon substrate, or high tensile stress (see Sherman, pages 68–77), or the process may incorporate unwanted by-products such as moisture, which degrades the film properties.

U.S. Pat. No. 5,551,985 by Brors et al. describes a CVD reactor that provides improved uniformity in heating a wafer, and a highly uniform gas flow across the surface of a wafer. U.S. Patent. No. applications Ser. Nos. 08/909,461 filed on Aug. 11, 1997, and 09/228,835 and 09/228,840 filed on Jan. 12,1999, the disclosures of which are incorporated herein by reference, describe wafer chambers in which related processes may also be used.

SUMMARY OF THE INVENTION

It is an object of the present invention to provide an improved method of depositing silicon dioxide.

It is another object of the present invention to provide a method of depositing silicon dioxide that results in a high rate of deposition.

It is a further object of the present invention to provide a method of depositing silicon dioxide at a high rate of deposition without the use of plasma enhancement.

It is a still further object of the present invention to provide a method of chemical vapor deposition of silicon dioxide resulting in a high rate of deposition and good film uniformity.

It is another object of the present invention to provide a method of rapid deposition of silicon dioxide at a low chamber pressure that avoids moisture inclusion and gas phase nucleation.

Briefly, a preferred embodiment of the present invention includes a method of depositing silicon dioxide providing a high rate of deposition at a low process chamber pressure, yielding a film with excellent uniformity, and with an absence of moisture inclusion and gas phase nucleation. According to the method, a wafer is placed in a reaction chamber wherein a reactant gas flow of silane and oxygen is directed in parallel with the wafer via a plurality of temperature-controlled gas injectors, and confined to a narrow region above the wafer. The gas is injected at a high velocity resulting in the deposition rate being limited only by the rate of delivery of unreacted gas to the wafer surface and the rate of removal of by-products. The high velocity gas stream passing across the wafer has the effect of thinning the layer adjacent the wafer surface containing reaction by-products, known as the "boundary layer," which results in faster delivery of the desired reactant gas to the wafer surface. The high velocity gas flow causes a very low gas residence time in the area of interest (i.e. above the substrate surface). The gas flow sweeps out unwanted reaction by-products resulting in a further increase in the relative concentration of the desired reactant species and reduced incorporation of unwanted reaction by-products in the deposited film.

An advantage of the present invention is that it provides an improved method of rapid deposition of silicon dioxide.

A further advantage of the present invention is that it provides a method of rapidly depositing a silicon dioxide film with improved film surface uniformity.

A still further advantage of the present invention is that it provides a method of depositing silicon dioxide at a high rate with a corresponding film of improved uniformity while avoiding moisture inclusion and gas phase nucleation.

IN THE DRAWING

FIG. 3 is a list of process specifications of the method of the present invention.

DETAILED DESCRIPTION OF THE PREFERRED EMBODIMENTS

Figure 1:
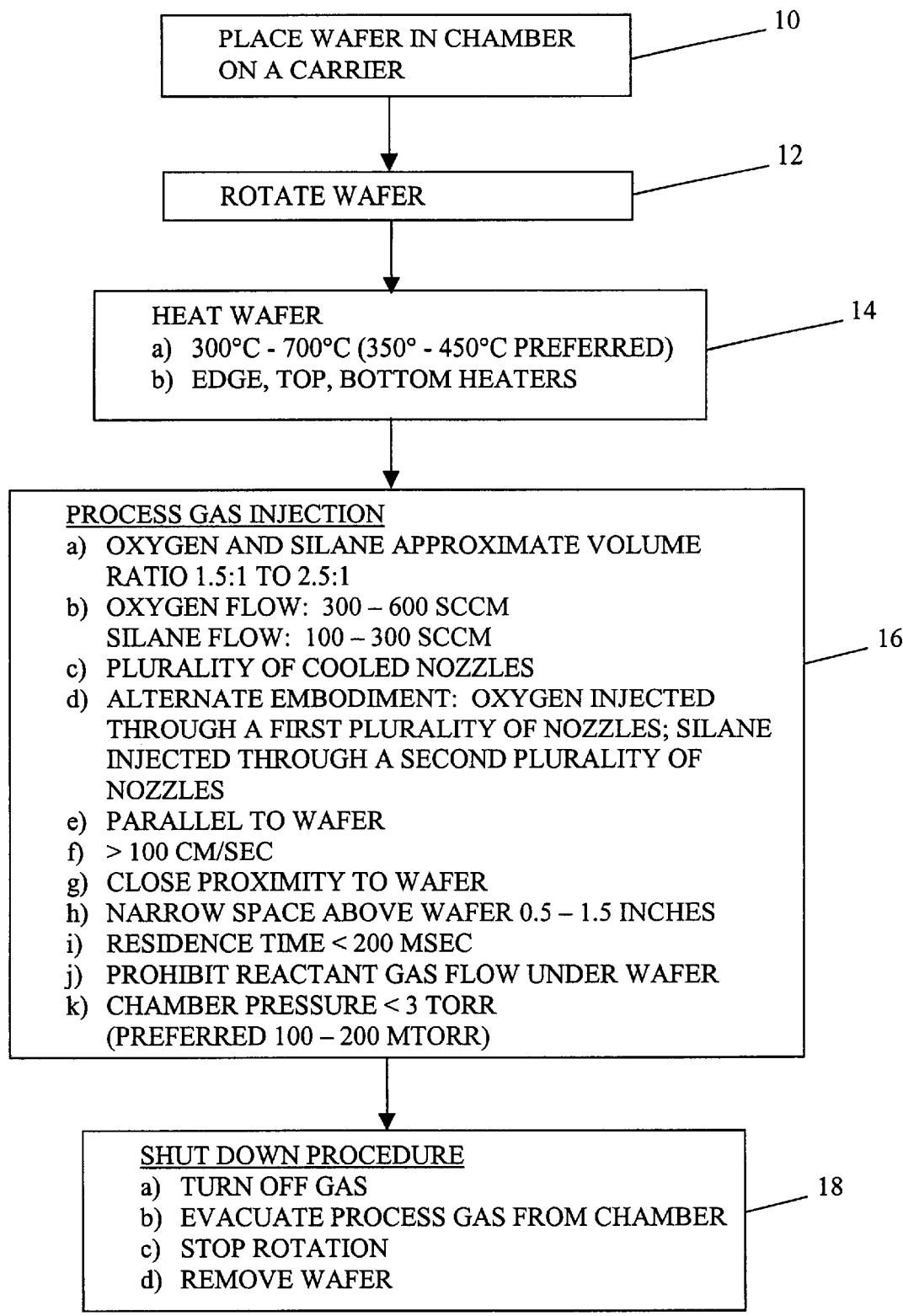
FIG. 1 is a flow chart illustrating the method of the present invention.

The method of the present invention will now be described in reference to the flow chart of FIG. 1. The process begins by placing a wafer on a carrier in a deposition chamber, for deposition of silicon dioxide (10). The carrier is rotated (12) and heated (14). The order of steps 12 and 14 is not significant in that the rotation is for the purpose of enhancing the uniformity of silicon dioxide deposition, and may be initiated any time prior to the injection of the reactant gases and then maintained during the deposition. The wafer is preferably heated as uniformly as possible, with heat sources above, below and surrounding the edge of the wafer. The temperature range for heating the wafer is between 300° C. and 500° C.

When the wafer is at the desired temperature, the process gases including oxygen and silane are injected (16). The preferred volume ratio of oxygen-to-silane is in the range of 1.5:1 to 2.5:1, with an oxygen flow rate in the range of 300–600 sccm and a silane flow rate in the range of 100–300 sccm. The gas pressure in the chamber is preferably maintained between 150 mTorr and 200 mTorr, and the gas preferably injected through a plurality of cooled injector nozzles with injection ports in close proximity to the wafer edge, the nozzles oriented so as to direct the flow parallel and close to the wafer surface. The gas is controlled to flow at a velocity in excess of 100 cm/second across the wafer surface in a narrow space confined to the region from the wafer surface to a maximum distance above the wafer of ½" to 1½". The velocity of the gas should be sufficient to reduce the gas residence time to less than 500 milliseconds and preferably less than 200 milliseconds.

Subsequent to deposition, the gas is turned off and evacuated from the chamber, the rotation is stopped, and the wafer removed (18).

The results achievable with the method of the present invention as described above in reference to FIG. 1 represent a major improvement in silicon dioxide deposition.

A major advantage of the present invention is that the method provides a very high deposition rate at low chamber pressures, resulting in very smooth, uniform and consistent surfaces. With the method of the present invention, deposition rates of 500 Å/minute are achieved at chamber pressures less than 1 Torr. Film uniformity is typically better than 3%, measured between the center of a 200 mm diameter silicon wafer and a point 3 mm from the edge of the wafer. In general, the film surface uniformity improves as the process pressure is reduced. Because the deposition rate decreases with pressure, operation of prior art systems at low pressures resulted in unacceptably low deposition rates. The method of the present invention enhances the deposition rate for a given pressure, providing acceptable deposition rates at low pressures. In the present invention, film surface uniformity is better at 500 mTorr or less, and a preferred pressure range for optimum surface uniformity is between 100 –200 mTorr. The reasons for the improved performance of the method of the present invention will now be described in detail, referring to each of the critical parameters of pressure, temperature and gas velocity.

In accordance with the present invention, a wafer/substrate is placed on a rotatable carrier in a vacuum chamber wherein a high velocity reactant gas for depositing silicon dioxide, such as oxygen and silane, enter the reactor/chamber in relatively close proximity to the rotated, heated wafer. The gas is injected across the wafer at a velocity in excess of 10 cm/second and preferably at least 50 to 10 cm/second, and is confined to a very narrow region above the wafer so as to maximize the gas concentration at the wafer surface. According to the method, the reactant gas is preferably confined to the region extending from the wafer surface to ½", but no more than 1½", above the wafer. The high velocity gas stream passing across the wafer surface has the effect of thinning what is known as a "boundary layer" immediately above the wafer. The boundary layer is a region wherein unwanted reaction by-products collect. This layer normally slows the rate of incidence of reactant gas, and thereby slows the rate of deposition. The high velocity gas stream of the present invention sweeps out the unwanted by-products, thinning the boundary layer, allowing a higher rate of desired reactant gas to reach the wafer surface, i.e., resulting in a further increase in the relative concentration of the desired reactant species and a corresponding increase in silicon dioxide deposition. The thinning of the boundary layer has the additional advantage of reducing incorporation of unwanted reaction by-products in the deposited film.

The method of the present invention provides a combination of elements, including a reactant gas including oxygen and silane provided at a volume ratio between 1.5:1 and 2.5:1, and injected across the wafer at a velocity in the range of 100 cm/second or more, causing removal of unwanted by-products and reducing the boundary layer, operation between 300° C. and at a pressure less than 3 Torr and preferably less than 1 Torr. The result is a very high deposition rate in the range including 500 Å/minute.

The non-uniformity of the deposited silicon dioxide layer using the method is less than 3%, measured between the center of the wafer and a point 3 mm from the edge of a 200 mm diameter wafer.

Figure 2:
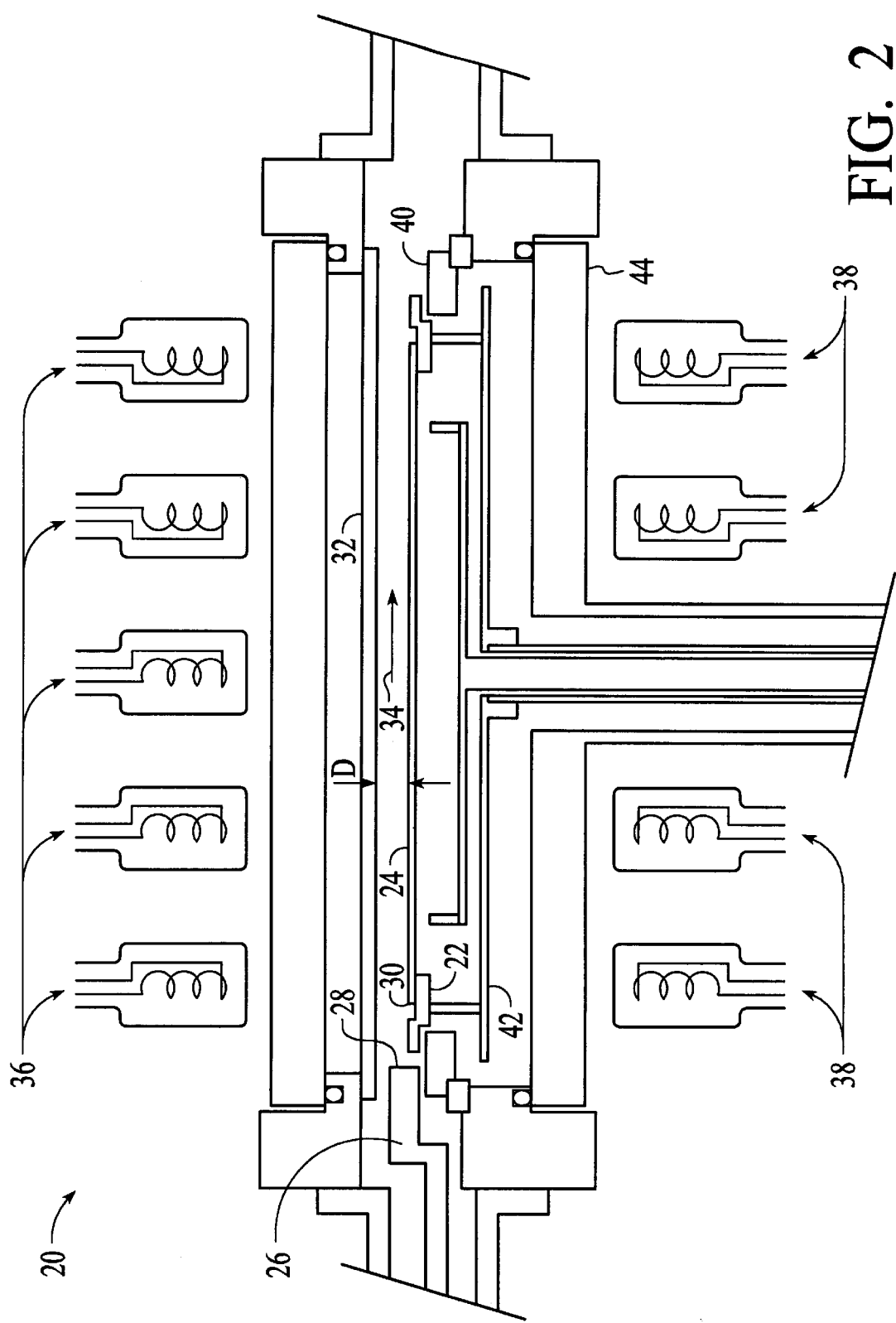
FIG. 2 is an apparatus presented to illustrate application of the method of the present invention.

The development of the method of the present invention was accomplished through use of a reactor similar to that shown in the cross-sectional view of FIG. 2. The structure of this apparatus is described in detail in U.S. Pat. No. 5,551,985. According to the method, a reactant gas is injected in close proximity to the edge of the wafer, and directed across and parallel to the wafer surface at a high velocity, confined to a narrow region above the wafer. FIG. 2 shows a reactor 20 having a rotatable susceptor 22 upon which is placed a wafer 24. A gas injector apparatus 26, including a plurality of nozzles with jets/openings 28, is positioned in close proximity to the wafer edge 30, and is oriented to direct a flow of reactant gas across and parallel to the wafer 24. The gas is further confined to a narrow region of width D above the wafer surface by a thermal plate 32 positioned over the wafer. The optimum gap D lies between ½Δ and 1½", and the speed of gas flow from injector 26 across the wafer was found to optimally exceed 100 cm/second in the direction indicated by arrow 34, for the purpose of optimum reactant gas supply to the wafer surface and removal of reaction by-products according to the method described above.

FIGS. 7 and 9 of U.S. Pat. No. 5,551,985 show a gas injector, representative of injector 26 of FIG. 2, with a plurality of nozzles. According to an alternate embodiment of the present invention, a first process gas such as oxygen is injected through a first plurality of the nozzles, and a second process gas such as silane is injected through a second plurality of the nozzles, the first and second plurality of nozzles being selected from the array of nozzles such as those illustrated in FIGS. 7 and 9 of U.S. Pat. No. 5,551,985.

According to the order of operations described in reference to FIG. 1, the substrate/wafer 24 is first placed on a carrier 22 and then brought to an operating temperature between 300° C. and 700° C., or preferably between 350° C. and 450° C. Typically, the apparatus of FIG. 2 can reach the temperature in about 20 seconds with heaters 36 above, 38 below, and a heat block 40 surrounding the carrier, the combination providing the advantage of uniform heating of the wafer 24. The carrier is then rotated at a speed of approximately 5 RPM, and the reactant gas including oxygen and silane is injected. The method of the present invention minimizes deposition on chamber surfaces by specifying that the reactant gas be confined to a narrow region above the substrate. The apparatus of FIG. 2 further assists in this objective by blocking reactant gas from passing underneath the substrate. This is accomplished by injecting a non-reactive gas (argon) at a low pressure under the substrate, between thermal plate 42 and lower quartz window 44. The details of the apparatus construction are fully described in U.S. Pat. No. 5,551,985, incorporated herein by reference.

The preferred specifications for the method according to the present invention are listed in FIG. 3, including an oxygen flow rate in the range of 300–600 sccm, and a silane flow rate of 100–300 sccm, with a volume ratio of oxygen-to-silane between 1.5:1 and 2.5:1, a chamber pressure preferably in the range of 100–200 mTorr but less than 3 Torr and preferably less than 1 Torr, a gas velocity in excess of 10 cm/second and preferably at least 50 to 100 cm/second confined to ½" over the wafer yielding a gas residence time of less than 500 milliseconds and preferably less than 200 milliseconds, a wafer uniformly heated to a temperature in the range of 300° C.–700° C. (preferably 350° C.–450° C.), and wafer rotation at a preferred rate of 5 RPM. Other rotation speeds are also included in the spirit of the present invention.

Other factors that contribute to the performance of the method applied to the apparatus of FIG. 2 include the plurality of water-cooled injector nozzles, prevention of reactant gas flow underneath the wafer, gas nozzles/jets directed across and positioned close to the ends of the wafer, and uniform wafer heating with heaters above, below, and around the edge of the wafer. The plurality of nozzles is illustrated in FIGS. 7 and 9 of U.S. Pat. No. 5,551,985, the entirety of which is included in the present disclosure by reference. The present invention includes injection of oxygen through a first plurality of the nozzles, and silane injected through a second plurality.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of depositing silicon dioxide, comprising:

(a) placing a wafer on a carrier in a deposition chamber;

(b) rotating said carrier;

(c) heating said wafer to a temperature in the range of 300° C.–700° C.;

(d) injecting a process gas for deposition of silicon dioxide parallel to a surface of said wafer at a rate of at least 10 cm/sec; and (e) maintaining a chamber pressure at a value less than 1 Torr.

2. A method as recited in claim 1 wherein said wafer is heated to a temperature between 350° C. and 450° C.

3. A method as recited in claim 1 wherein said velocity is adjusted to cause an average gas residence time less than 500 milliseconds.

4. A method as recited in claim 1 wherein said process gas includes oxygen and silane.

5. A method as recited in claim 4 wherein said oxygen is introduced into said chamber at a flow rate between 300–600 sccm, and said silane is introduced into said chamber at a flow rate between 100–300 sccm.

6. A method as recited in claim 1 wherein said chamber pressure is maintained in the range from 100–200 mTorr while said process gas is being introduced into said chamber.

7. A method as recited in claim 1 wherein said process gas is introduced to a plurality of gas nozzles positioned so as to concentrate the gas at the surface of the wafer.

8. A method as recited in claim 7 wherein said gas nozzles are temperature-controlled.

9. A method as recited in claim 7 wherein said gas nozzles are water-cooled.

10. A method as recited in claim 7 wherein said gas nozzles are directed at a wafer surface.

11. A method as recited in claim 4 wherein each said process gas enters through a plurality of separate nozzles.

12. A method as recited in claim 1 wherein the reactant gas is directed so as to concentrate the gas at a surface of said wafer.

13. A method as recited in claim 10 wherein a distance between the wafer and an upper heat shield is less than 1½".

14. A method as recited in claim 10 wherein a distance between the wafer and an upper heat shield is less than 0.6".

15. A method as recited in claim 1 wherein the process gas is prevented from passing below the wafer.

* * * * *